United States Patent
Hargreaves

(10) Patent No.: US 9,608,613 B2
(45) Date of Patent: Mar. 28, 2017

(54) EFFICIENT HIGH VOLTAGE SQUARE WAVE GENERATOR

(71) Applicant: SYNAPTICS INCORPORATED, San Jose, CA (US)

(72) Inventor: Kirk Hargreaves, Mountain View, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 101 days.

(21) Appl. No.: 14/788,677

(22) Filed: Jun. 30, 2015

(65) Prior Publication Data
US 2017/0005646 A1    Jan. 5, 2017

(51) Int. Cl.
| | |
|---|---|
| H03K 3/017 | (2006.01) |
| H03K 5/156 | (2006.01) |
| G06F 3/0354 | (2013.01) |
| H03K 3/037 | (2006.01) |
| H03K 5/24 | (2006.01) |
| H03K 5/02 | (2006.01) |
| H03K 5/08 | (2006.01) |
| H03K 5/04 | (2006.01) |
| H03K 7/08 | (2006.01) |

(52) U.S. Cl.
CPC ....... *H03K 5/1565* (2013.01); *G06F 3/03545* (2013.01); *H03K 3/037* (2013.01); *H03K 5/24* (2013.01); *H03K 3/017* (2013.01); *H03K 5/02* (2013.01); *H03K 5/04* (2013.01); *H03K 5/08* (2013.01); *H03K 7/08* (2013.01)

(58) Field of Classification Search
None
See application file for complete search history.

(56) References Cited

U.S. PATENT DOCUMENTS

| | | | |
|---|---|---|---|
| 4,347,560 A | 8/1982 | Seiersen | |
| 4,649,467 A | 3/1987 | Vesce et al. | |
| 5,801,379 A | 9/1998 | Kouznetsov | |
| 5,907,254 A * | 5/1999 | Chang | H03K 5/1565 327/165 |
| 6,214,297 B1 | 4/2001 | Zhang et al. | |
| 6,686,862 B1 * | 2/2004 | Tagare | H03K 5/1565 327/172 |
| 7,969,221 B2 | 6/2011 | Lu | |

(Continued)

FOREIGN PATENT DOCUMENTS

| | | |
|---|---|---|
| WO | 9949561 A1 | 9/1999 |
| WO | 2011017802 A1 | 2/2011 |

*Primary Examiner* — Tuan T Lam
(74) *Attorney, Agent, or Firm* — Patterson + Sheridan, LLP

(57) ABSTRACT

This disclosure generally provides a system, active input device, and method for generating an amplified square wave signal based on an input signal. The method comprises generating a pulse signal based on the input signal, and driving a switching signal based on the pulse signal to control a first switch. A pulse width of the pulse signal is adaptively controlled using a control signal generated based on the amplified square wave signal. An output terminal of the first switch is coupled with a second switch, and the switching signal controls current entering into the second switch. The method further comprises driving the input signal to control a third switch coupled with the second switch. The amplified square wave signal is generated at the second output terminal based on the switching signal and on the input signal.

20 Claims, 12 Drawing Sheets

(56) References Cited

U.S. PATENT DOCUMENTS

| | | | |
|---|---|---|---|
| 8,149,064 B2 | 4/2012 | Paul et al. | |
| 8,923,462 B2* | 12/2014 | Choi | H04L 25/4902 |
| | | | 327/175 |
| 2003/0151453 A1* | 8/2003 | Laletin | H03K 5/06 |
| | | | 327/551 |
| 2009/0302911 A1* | 12/2009 | Wang | H03K 3/017 |
| | | | 327/172 |
| 2010/0188126 A1* | 7/2010 | Cheung | H03K 5/1565 |
| | | | 327/175 |
| 2013/0049832 A1* | 2/2013 | Wong | H03K 3/017 |
| | | | 327/159 |
| 2013/0278231 A1* | 10/2013 | Kuo | H03K 3/017 |
| | | | 323/234 |

\* cited by examiner

EFFICIENT HIGH VOLTAGE SQUARE WAVE GENERATOR

BACKGROUND

Field

Embodiments of the present disclosure generally relate to electronic devices.

Description of the Related Art

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location, and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

BRIEF SUMMARY

One embodiment described herein includes a system for generating an amplified square wave signal based on an input signal. The system comprises a variable-width pulse generator configured to generate, based on the input signal, a pulse signal having a pulse width, and a feedback module configured to generate a control signal based on the amplified square wave signal, the pulse width of the pulse signal based on the control signal. The system further comprises a first switch having a first control terminal and a first output terminal, a second switch having a second control terminal and a second output terminal, the second output terminal coupled with the first control terminal of the first switch, wherein the second switch is configured to receive at the second control terminal a first switching signal based on the pulse signal. The system further comprises a third switch having a third control terminal and a third output terminal, the third output terminal coupled with the first output terminal of the first switch, wherein the third switch is configured to receive a second switching signal at the third control terminal. In response to the first and second switching signals provided to the second and third switches, the amplified square wave signal is generated at the first output terminal of the first switch.

Another embodiment described herein includes an active input device that comprises a controller configured to generate an unamplified input signal and a boost arrangement coupled with the controller and configured to generate an amplified square wave signal based on the input signal. The boost arrangement comprises a variable-width pulse generator configured to generate, based on the input signal, a pulse signal having a pulse width, and a feedback module configured to generate a control signal based on the amplified square wave signal, the pulse width of the pulse signal based on the control signal. The boost arrangement further comprises a first switch having a first control terminal and a first output terminal, and a second switch having a second control terminal and a second output terminal, the second output terminal coupled with the first control terminal of the first switch, wherein the second switch is configured to receive at the second control terminal a first switching signal based on the pulse signal. The boost arrangement further comprises a third switch having a third control terminal and a third output terminal, the third output terminal coupled with the first output terminal of the first switch, wherein the third switch is configured to receive a second switching signal at the third control terminal. In response to the first and second switching signals provided to the second and third switches, the amplified square wave signal is generated at the first output terminal of the first switch.

Another embodiment described herein includes a method of generating an amplified square wave signal based on an input signal. The method comprises generating, based on the input signal, a pulse signal having a pulse width, and driving a switching signal based on the pulse signal onto a first control terminal of a first switch. A first output terminal of the first switch is coupled with a second switch having a second control terminal and a second output terminal, and current entering into the second switch is controlled based on the switching signal. The method further comprises driving the input signal onto a third control terminal of a third switch. A third output terminal of the third switch is connected to the second output terminal of the second switch, and the amplified square wave signal is generated at the second output terminal based on the switching signal and on the input signal. The method further comprises generating a control signal based on the amplified square wave signal, wherein the pulse width of the pulse signal is based on the control signal.

BRIEF DESCRIPTION OF DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
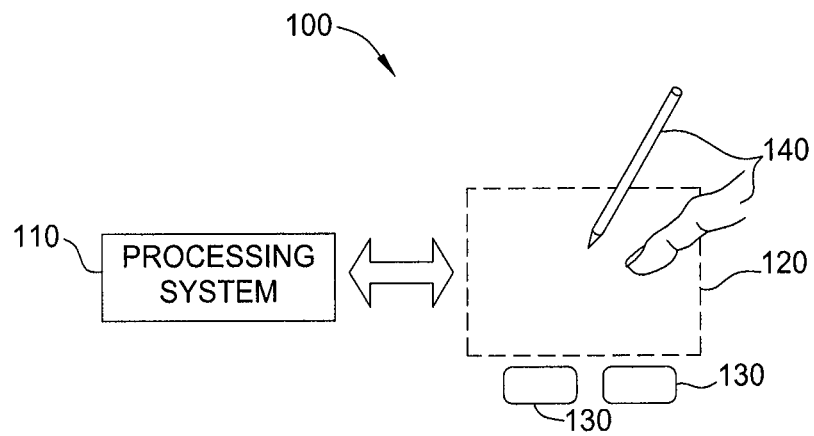
FIG. 1 is a block diagram of an exemplary input device, according to embodiments described herein.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or its application and uses. Furthermore, there is no intention to be bound by any expressed or implied theory presented in the preceding technical field, background, brief summary or the following detailed description.

The embodiments of the present disclosure include a system, an active input device, and a method of generating an amplified square wave signal based on an input signal. The system can be implemented as a boost arrangement that receives the unamplified input signal from a controller of the active input device, and generates an amplified square wave signal suitable for transmission from the active input device. The amplified square wave signal may be received at a sensing region of an input device, such as a touchscreen or other sensing device. Generating the amplified square wave signal with the boost arrangement can be performed without using a separate oscillator, which offers a significant reduction in power consumption when compared with oscillator-based designs. The system is further capable of maintaining a desired peak-to-peak voltage for the amplified square wave signal across variations in input signal voltage, different components, and varying loads. The system also generally allows for the use of smaller components (e.g., smaller inductors) while meeting duty cycle requirements for the amplified square wave signal to provide suitable input to the input device.

Turning now to the figures, FIG. 1 is a block diagram of an exemplary input device 100, in accordance with embodiments of the disclosure. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional examples of electronic systems include composite input devices, such as physical keyboards that include input device 100 and separate joysticks or key switches. Further examples of electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include $I^2C$, SPI, PS/2, Universal Serial Bus (USB), Bluetooth, RF, and IrDA.

In FIG. 1, the input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g., a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements for detecting user input. As several non-limiting examples, the input device 100 may use capacitive, elastive, resistive, inductive, magnetic, acoustic, ultrasonic, and/or optical techniques.

Some implementations are configured to provide images that span one, two, three, or higher dimensional spaces. Some implementations are configured to provide projections of input along particular axes or planes.

In some resistive implementations of the input device 100, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 100, one or more sensing elements pick up loop currents induced by a resonating coil or pair of coils. Some combination of the magnitude, phase, and frequency of the currents may then be used to determine positional information.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive.

In FIG. 1, a processing system 110 is shown as part of the input device 100. The processing system 110 is configured to operate the hardware of the input device 100 to detect input in the sensing region 120. The processing system 110 comprises parts of or all of one or more integrated circuits (ICs) and/or other circuitry components. For example, a processing system for a mutual capacitance sensor device may comprise transmitter circuitry configured to transmit signals with transmitter sensor electrodes, and/or receiver circuitry configured to receive signals with receiver sensor electrodes. In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g., to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

It should be understood that while many embodiments of the disclosure are described in the context of a fully functioning apparatus, the mechanisms of the present disclosure are capable of being distributed as a program product (e.g., software) in a variety of forms. For example, the mechanisms of the present disclosure may be implemented and distributed as a software program on information bearing media that are readable by electronic processors (e.g., non-transitory computer-readable and/or recordable/writable information bearing media readable by the processing system 110). Additionally, the embodiments of the present disclosure apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2:
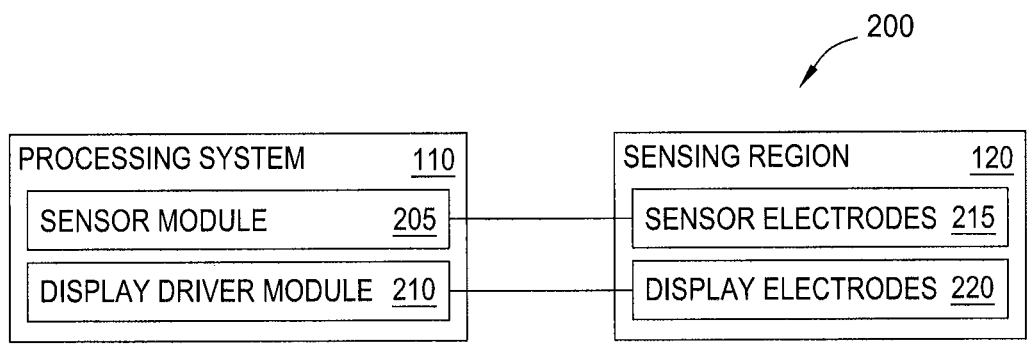
FIG. 2 is a block diagram of a processing system coupled with sensor electrodes and display electrodes, according to embodiments described herein.

FIG. 2 is a block diagram of processing system 110 coupled to sensor electrodes 215 and display electrodes 220 in accordance with an embodiment of the disclosure. Specifically, FIG. 2 illustrates a system 200 where processing system 110 is coupled to electrodes in the sensing region 120. The processing system 110 includes a sensor module 205 and display driver module 210. As stated above, each module may comprise circuitry that is a part of the processing system 110, firmware, software, or a combination thereof. The sensor module 205 is coupled to the sensor electrodes 215 and is used to perform capacitive sensing by driving a capacitive sensing signal onto the sensor electrodes 215 and measuring an effect caused by the capacitive sensing signal (e.g., a change in charge, current, voltage, etc.).

In one embodiment, a set of measurements from a plurality of capacitive pixels form a "capacitive image" (also "capacitive frame") representative of the capacitive couplings at the capacitive pixels. Multiple capacitive images may be acquired over multiple time periods, and differences between them used to derive information about input in the sensing region 120. For example, successive capacitive images acquired over successive periods of time can be used to track the motion(s) of one or more input objects entering, exiting, and within the sensing region 120. In one embodiment, the sensor module 205 uses sensor bursts to measure the capacitive pixels and form the capacitive image or frame. However, because interfering signals may affect the measurements acquired during the sensor bursts, the sensor module 205 uses one or more interference bursts during each capacitive frame to perform interference detection. For example, the interference bursts may be performed the beginning or end of each capacitive frame. If the sensor module 205 detects an interfering signal, the sensor module 205 may change the frequency of the sensor bursts.

The display driver module 210 is coupled to a plurality of display electrodes 220 which are used to update display lines in a display. In one embodiment, the operation of the display driver module 210 may control when the sensor module 205 performs capacitive sensing. For example, once updated display data is received, the display driver module 210 may pause capacitive sensing performed by the sensor module 205 and update the display using the received display data. Once the display is updated, the display driver module 210 may resume capacitive sensing. As such, the interference bursts may be separated from one or more of the sensor bursts in the same capacitive fame by a display update period.

The display driver module 210 may be included with or separate from the sensor module 205. In one embodiment, the processing system comprises a first integrated controller comprising the display driver module 210 and at least a portion of the sensor module 205 (i.e., transmitter module and/or receiver module). In another embodiment, the processing system comprises a first integrated controller comprising the display driver module 210 and a second integrated controller comprising the sensor module 205. In yet another embodiment, the processing system comprises a first integrated controller comprising a display driver module 210 and a first portion of the sensor module 205 (e.g., one of a transmitter module and a receiver module) and a second integrated controller comprising a second portion of the sensor module 205 (e.g., the other one of the transmitter and receiver modules).

In one embodiment, one or more of the sensor electrodes 215 include one or more display electrodes 220 used in updating the display. That is, instead of the sensor electrodes 215 being separate from the display electrodes 220 as shown, a shared or common electrode may be used to perform both capacitive sensing and display updating. In one or more embodiment, the common electrodes may comprise one or more segments of a Vcom electrode, a source drive line, gate line, an anode electrode or cathode electrode, or any other display element. Because the common electrodes may be used both when performing capacitive sensing and when updating the display, in one embodiment, the processing system 110 may perform capacitive sensing and display updating during non-overlapping time periods. In other embodiments, processing system 110 may perform capacitive sensing and display updating during overlapping time periods. Further, in some embodiments, capacitive sensing and display updating may occur with any combination of non-overlapping and overlapping time periods. The common electrodes may be disposed on a transparent substrate (a glass substrate, TFT glass, or any other transparent material) in some display screens (e.g., In-Plane Switching (IPS) or Plane-to-Line Switching (PLS) Organic Light Emitting Diode (OLED)), on the bottom of the color filter glass of some display screens (e.g., Patterned Vertical Alignment (PVA) or Multi-domain Vertical Alignment (MVA)), over an emissive layer (OLED), etc. In such embodiments, the common electrode can also be referred to as a "combination electrode," since it performs multiple functions. In various embodiments, each of the sensor electrodes 215 comprises one or more common electrodes. In other embodiments, at least two sensor electrodes 215 may share at least one common electrode.

In some embodiments, the input device 100 and/or system 200 are configured to sense one or more active input devices in proximity of the sensing region 120. As defined herein, an active input device provides input by emitting one or more electrical or optical signals that are capable of being detected within a sensing region of an input device (e.g., the sensing region 120 of input device 100). Some non-limiting examples of active input devices include powered pens or styli, but other suitable form factors and arrangements may be used. An active input device generally includes a power source (such as a battery) and powered circuitry.

In one embodiment, the system 200 includes specialized circuitry for detecting signals emitted from an active input device. For example, the system 200 may include different types of sensor electrodes 215, antennas, receivers, etc. that are specifically configured to receive the emitted signals. In other embodiments, components already included in the system 200 and configured to perform capacitive or other sensing may be further configured to receive the emitted signals. The processing system 110 may control the operation of the sensor electrodes 215 and/or other components to suitably distinguish input received from an active input device from capacitive sensing input. For example, the processing system may operate the sensor electrodes 215 in a first input mode for performing capacitive sensing, and in a second input mode for receiving input from an active input device. In another example, the processing system may use time and/or frequency separation to distinguish capacitive sensing input from input provided by an active input device.

Figure 3:
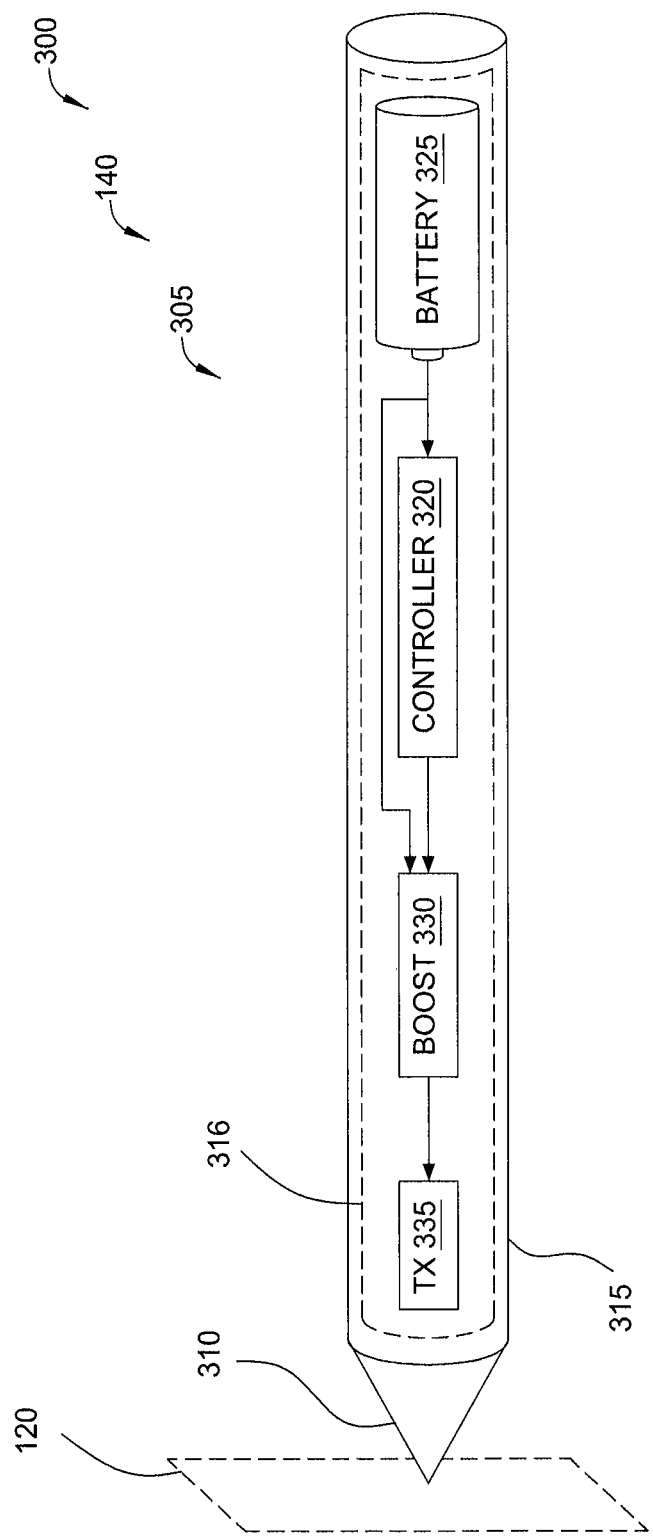
FIG. 3 illustrates an exemplary active input device, according to embodiments described herein.

FIG. 3 illustrates an exemplary active input device, according to embodiments described herein. As shown, active input device 300—which is one example of the input objects 140—is disposed near the sensing region 120. Active input device 300 is depicted as an active pen, which includes various circuitry elements disposed within a housing 305. The housing 305 itself may include one or more distinct portions, such as a cylinder 315 and a pen tip 310 connected or formed therewith.

The active input device 300 generates and transmits input signals that are detectable by sensing elements disposed near the sensing region 120 (such as sensor electrodes 215). Signals that are transmitted by the active input device 300 may be coupled into one or more of the sensing elements, thereby providing information to the processing system 110. Some examples of information may include positional data, the operational state of various components of the active input device 300 (e.g., a force applied on the pen tip 310, whether buttons formed in the housing 305 are depressed), battery data, device identification data, and so forth. In some embodiments, the signals emitted by the active input device 300 have the form of a square wave; however, any suitable alternative signal waveforms are possible.

A cutaway portion 316 of the cylinder 315 illustrates several components that may be included within the housing 305. The components include a controller 320, one or more batteries 325, a boost arrangement 330 (boost 330), and transmit hardware 335 (TX 335). While not explicitly discussed here, the housing 305 may include additional circuitry components, such as receive hardware, buttons, switches, sensors, indicators, and so forth.

Controller 320 is generally configured to administer and/or operate the various components within the active input device 300 and to communicate with external devices such as the input device. The controller 320 may have any suitable form, such as a general purpose microprocessor having one or more cores, a controller, an application-specific integrated circuit (ASIC), and so forth. In some embodiments, the controller 320 comprises parts of (or all of) one or more integrated circuits (ICs) and/or other circuitry components. In some embodiments, controller 320 also comprises electronically-readable instructions, such as firmware code, software code, and the like.

Controller 320 receives electrical power from the battery 325. In one embodiment, the active input device 300 supports a wired connection with another device that supplies power to the controller 320 and/or recharges the battery 325. Some examples of the connected device include the input device itself, another computing device, an external battery pack or wall adapter, and so forth.

The battery 325 may have any suitable characteristics. Battery 325 may be fixed or removable from the housing 305, may be a disposable (e.g., alkaline) or a rechargeable battery, and so forth. In some cases, battery 325 may have an industry-standard size, such as "AA," "AAA," or "AAAA." In some embodiments, the voltage supplied by the battery 325 may be inadequate for producing an input signal with desired properties from the active input device 300, and one or more stages of boosting are included to increase voltages to desired levels. Boost arrangement 330 (boost 330) provides one example of voltage boosting, but more are possible (such as a boosting stage between the battery 325 and controller 320).

The controller 320 is configured to generate one or more unamplified input signals, which when amplified and/or otherwise processed, are suitable for transmission from the active input device 300 and receipt by the associated input device. In some embodiments, the unamplified input signals may be in the form of a square wave having a suitable frequency, duty cycle, etc. However, other forms of the unamplified input signals are possible.

The boost arrangement 330 receives the unamplified signal from the controller 320 and using electrical power from the battery 325 generates an amplified square wave signal that is suitable for transmission by the active input device 300. As will be discussed in greater detail below, the boost arrangement 330 may include various circuitry including passive and/or active elements, digital logic and/or analog circuitry, and so forth. In some embodiments, the boost arrangement 330 produces the amplified square wave signal without the use of a separate oscillator, which offers a significant reduction in power consumption when compared to oscillator-based designs. Additionally, the boost arrangement 330 is capable of maintaining a desired peak-to-peak voltage for the amplified square wave signal across input signal voltage, component, and load variations.

The boost arrangement 330 provides the amplified square wave signal to the transmit hardware 335. In some embodiments, at least portions of the transmit hardware 335 is disposed at or near the pen tip 310 to provide a greater signal strength at the sensing region 120. The transmit hardware 335 may include any suitable active and/or passive elements. In one embodiment, transmit hardware 335 includes a conductive pen tip 310. In another embodiment, transmit hardware 335 includes an antenna or radio frequency (RF) transceiver.

Figure 4:
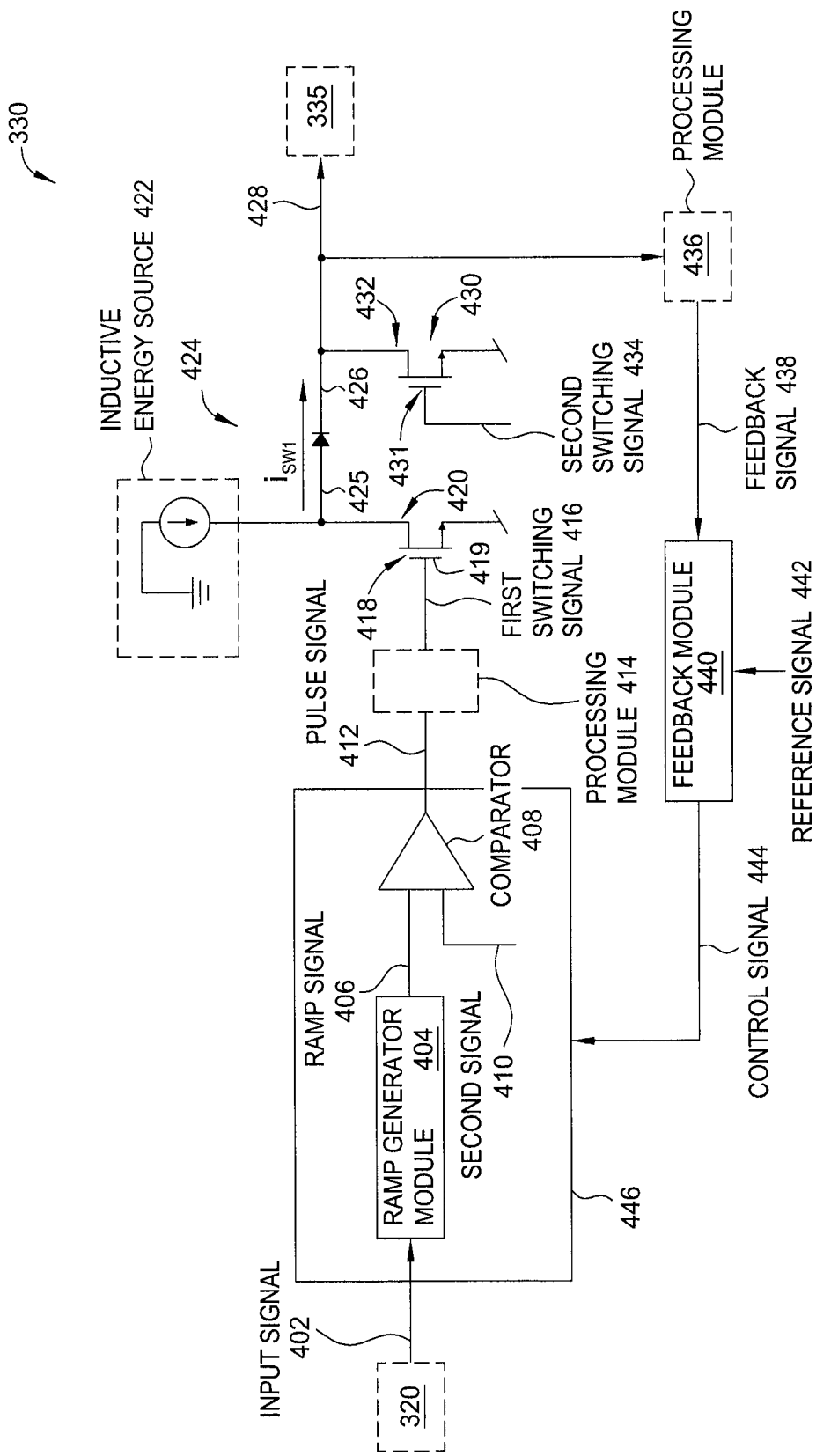
FIG. 4 illustrates a boost arrangement for an active input device, according to embodiments described herein.

FIG. 4 illustrates an exemplary boost arrangement, according to embodiments described herein. The boost arrangement 330 receives an input signal 402 from controller 320, which in some cases is a square wave signal having desired properties. A variable-width pulse generator generates a pulse signal 412 based on the received input signal 402. The pulse width of the pulse signal 412 may be adaptively controlled by a received control signal 444. Several exemplary implementations of the variable-width pulse generator 446 are discussed further below with respect to FIG. 11.

In some embodiments, the variable-width pulse generator 446 comprises a ramp generator 404 configured to generate a ramp signal 406 based on the input signal 402. A comparator 408 receives the ramp signal 406 at a first input, and a second signal 410 at a second input. In some embodiments, the second signal 410 is the control signal 444 generated by the feedback module 440. In other embodiments, the second signal 410 is a predetermined threshold voltage. The comparator 408 produces the pulse signal 412, which reflects the comparison of the ramp signal 406 with the second signal 410. As the particular configuration of comparator 408 can differ for different embodiments of the boost arrangement 330, the polarity of the input terminals of the comparator 408 is not indicated here.

A first switching signal 416 that is based on the pulse signal 412 drives the control terminal 419 of a first switch 418. In some embodiments, the first switch 418 may be a field-effect transistor (FET), bipolar junction transistor (BJT), or other suitable means for changing the conductance of the circuit. In the case of a FET as the switch 418, the control input is the gate of the FET. In one embodiment, the first switching signal 416 is the pulse signal 412. In another embodiment, the pulse signal 412 is received at a processing module 414 that produces the first switching signal 416 based on the pulse signal 412. The processing module 414 may include any number of suitable active and/or passive circuit elements, analog and/or digital logic components, etc. In one embodiment, processing module 414 includes one or more logic gates.

The first switch 418 is depicted as an n-channel metal-oxide-semiconductor FET (n-channel MOSFET or NFET). The control terminal 419 (gate) of switch 418 receives the first switching signal 416. An inductive energy source 422 having any suitable configuration is connected with output terminal 420 (drain) of switch 418. Depending on the first switching signal 416, current provided by the inductive energy source 422 is directed through the switch 418 (e.g., the channel of the FET) to ground, or directed through a second switch 424 (depicted as a diode) into other components of the boost arrangement 330. Generally, switch 424 may be a diode or any suitable controlled switch (such as a FET or BJT). As shown, a first terminal (anode) 425 of the switch 424 is coupled with the inductive energy source 422 at the output terminal 420 of switch 418. In some cases where the second switch 424 is a controlled switch, a control signal having an opposite phase of the first switching signal 416 may be applied to the control terminal of the controlled switch. The controlled switch may be configured to sense when the current flowing therethrough is reduced to substantially zero, and the controlled switch is shut off responsive thereto.

A second switch 430 (NFET) includes a control terminal 431 (gate) and output terminal 432 (drain). The output terminal 432 is coupled with a second, output terminal (cathode) 426 of the switch 424. Switch 430 receives a second switching signal 434 at control terminal 431, selectively providing a path to ground through the switch 430 (channel). In some cases, the input signal 402 is provided as the second switching signal 434. In some embodiments, the combination of operating first switch 418 using the first switching signal 416 to direct current flowing from the inductive energy source 422, and operating the second switch 430 using the second switching signal 434 generates an amplified square wave signal 428 at the second, output terminal (cathode) 426 of switch 424. The amplified square wave signal 428 may then be output to the transmitter hardware 335.

The boost arrangement 330 also includes a feedback module 440 to adjust the characteristics of the generated amplified square wave signal 428. The feedback module 440 receives a feedback signal 438 that is based on the amplified square wave signal 428. In one embodiment, the feedback signal 438 is the amplified square wave signal 428. In other embodiments, the amplified square wave signal 428 is passed through a processing module 436 to generate the feedback signal 438. The processing module 436 may include any suitable combination of active and/or passive circuit elements, analog and/or digital logic components, etc. to produce an appropriate feedback signal 428. In some embodiments, the processing module 436 may include voltage divider circuitry configured to output a scaled version of the amplified square wave signal 428 as the feedback signal 438.

The feedback module 440 may also receive a reference signal 442, comparing the feedback signal 438 with the reference signal 442 to determine characteristics for the control signal 444. The control signal 444 generated by the feedback module 440 is applied to one or more elements included in variable-width pulse generator 446 in order to influence the pulse signal 412 and/or the first switching signal 416 provided to the switch 418. The influence of the control signal 444 operates to adjust the characteristics of the generated amplified square wave signal 428. In some embodiments, the control signal 444 is applied as the second signal 410 input to the comparator 408. In other embodiments, the control signal 444 is applied to the ramp generator 404 in order to adapt the characteristics of the ramp signal 406.

Figure 5:
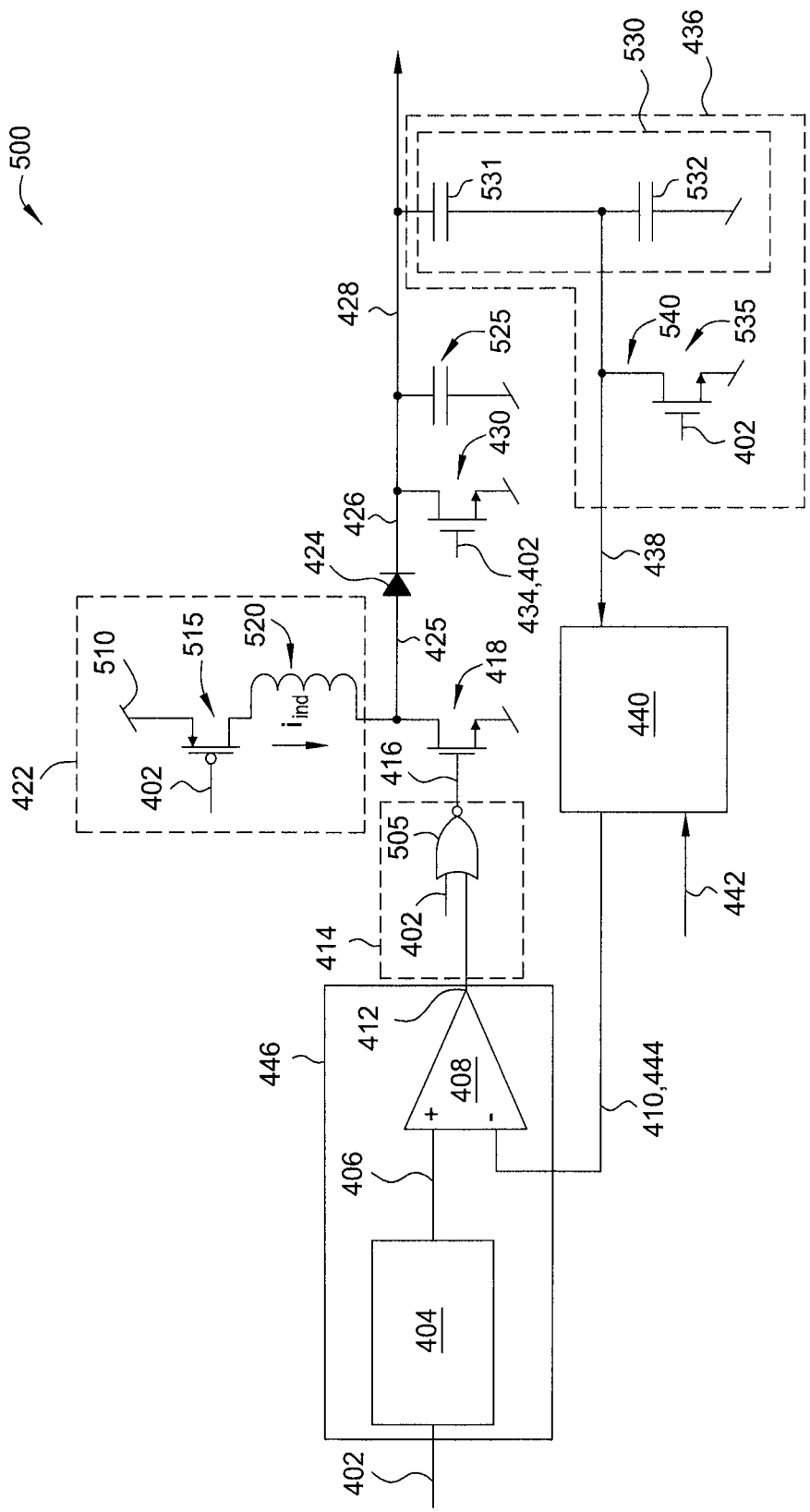
FIG. 5 illustrates an exemplary implementation of a boost arrangement, according to embodiments described herein.

FIG. 5 illustrates an exemplary implementation of a boost arrangement, according to embodiments described herein. Boost arrangement 500 represents one possible implementation of the boost arrangement 330, suitable for use in the active input device 300.

In boost arrangement 500, the input signal 402 is received at the variable-width pulse generator 446, and the ramp generator module 404 produces ramp signal 406. The ramp signal 406 is received at a positive terminal of the comparator 408, while the control signal 444 is received as the second input signal 410 at the negative terminal of the comparator 408. The pulse signal 412 is generated based on the comparison, and the pulse signal 412 is input to processing module 414.

As shown, processing module 414 includes a NOR gate 505 configured to receive the pulse signal 412 as one input, and the input signal 402 as the other input. Based on these input signals, the NOR gate 505 produces the first switching signal 416 used to operate the switch 418.

As shown, the inductive energy source 422 includes switch 515—a p-channel MOSFET (or PFET)—that is connected with a voltage source 510 at its source and an inductor 520 at its drain. The switch 515 receives the input signal 402 at its control terminal (gate), which essentially connects and disconnects the voltage source 510 from the inductor 520. The voltage source 510 provides a voltage at a predefined power supply level, such as $V_{DD}$ or $V_{BOOST}$, and is used to charge the inductor 520. Based on the switching of switches 418, 430, and 515, an amount of current $i_{IND}$ flows through the inductor 520 and is either coupled to ground across switch 418 or across switch 424. The switch 430 can provide a path to ground to produce logic "low" portions of the amplified square wave signal 428. As shown, the second switching signal 434 for switch 430 is the input signal 402.

Capacitance 525 represents the parasitic capacitance of the various switches of the boost arrangement 500, as well as connected components such as a conductive pen tip. Generally, the value of capacitance 525 should be kept as low as practical to improve efficiency of the boost arrangement 500.

Processing module 436 includes a voltage divider arrangement 530 coupled with an output terminal 426 (cathode) of the switch 424. The voltage divider arrangement 530 includes capacitors 531, 532 connected in series. The feedback signal 438 is generated based on the signal at the series connection between the capacitors 531, 532. The processing module 436 includes a switch 535 (NFET) having a control terminal (gate) configured to receive the input signal 402, and an output terminal (drain) connected with the series connection of the capacitors 531, 532. The switch 535 can provide a path to ground based on the state of input signal 402. In some embodiments, the switch 535 is operated to reset the feedback signal 438.

Figure 6:
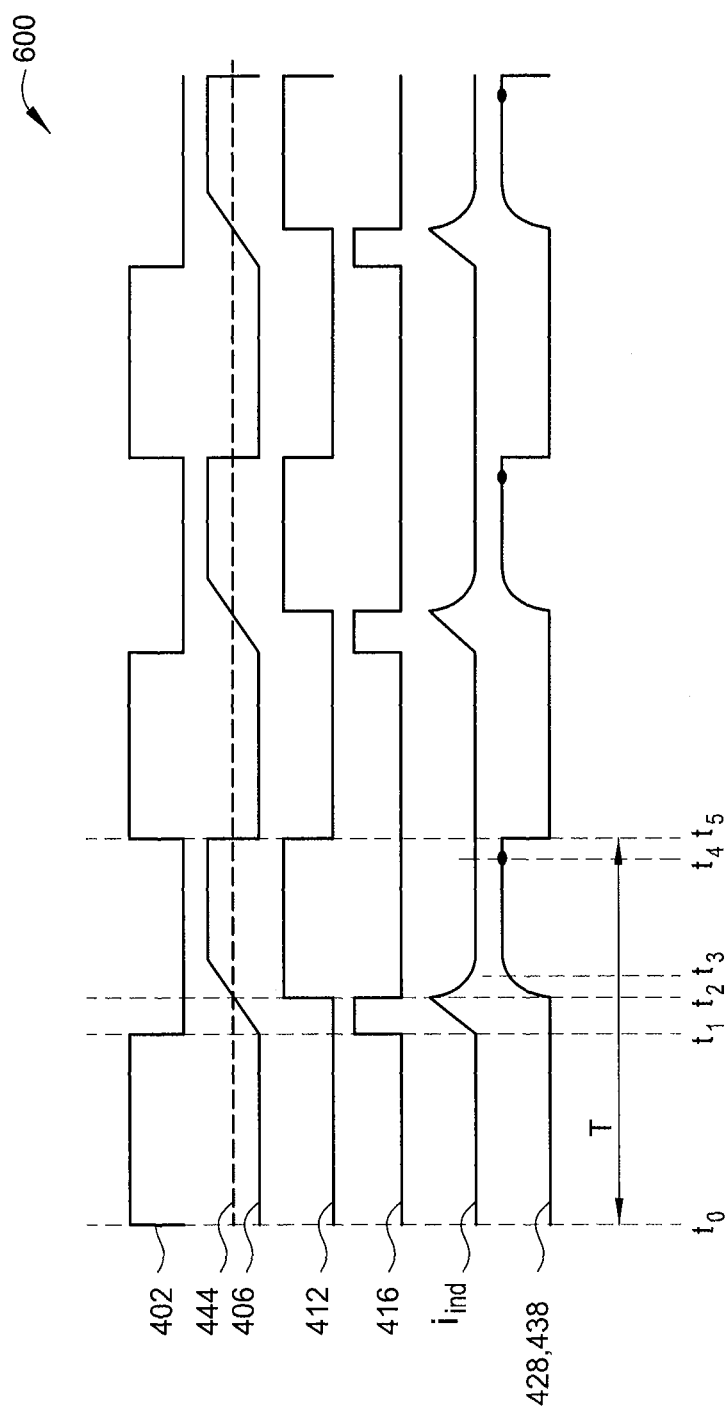
FIG. 6 illustrates exemplary operation of a boost arrangement, according to embodiments described herein.

FIG. 6 illustrates several signal plots illustrating operation of an exemplary boost arrangement, according to embodiments described herein. Specifically, chart 600 corresponds to operation of the boost arrangement 500.

As shown, input signal 402 is a square wave having a period T and having an approximately 50% duty cycle—that is, the amount of "on" time ($t_1-t_0$) equals the amount of "off" time ($t_5-t_1$). However, the duty cycle of the input signal 402 can be varied based on duty cycle requirements for the output signal (i.e., amplified square wave signal 428). In some embodiments, the input signal 402 represents a substantial inverse of the desired output signal, with the output signal having a shorter duty cycle.

At time $t_0$, the input signal 402 is driven "high" (corresponding to a logic "1"). The switch 430 is turned on, providing a path from the first terminal (cathode) 426 to ground and causing the amplified square wave signal 428 to go "low" (a logic "0").

Ramp signal 406 also goes "low" with the transition of input signal 402 to the "high" state. The control signal 444 is shown as a DC voltage level that is greater than the ramp signal 406 at time $t_0$, causing pulse signal 412 to be driven "low." The NOR gate 505 receives a "high" input signal 402 and a "low" pulse signal 412—fulfilling an OR condition—thus causing its output (first switching signal 416) to be driven "low."

With input signal 402 driven "high," both switch 418 and switch 515 are turned off, preventing inductor 520 from charging. Switch 535 is on, coupling the feedback signal 438 to ground.

At time $t_1$, the input signal 402 is driven "low" and the ramp signal 406 begins increasing. For the period between $t_1$ and $t_2$, the ramp signal 406 remains less than the control signal 444, so that pulse signal 412 remains "low." Because input signal 402 is also "low," the NOR condition is fulfilled. NOR gate 505 drives a logic "high" on the first switching signal 416, causing the switch 418 to turn on.

Switch 515 is also turned on with the "low" input signal 402, which connects the voltage source 510 with the inductor 520 through the switch 515. With switches 418 and 515 turned on, a path exists from the voltage source 510 across inductor 520 to ground and current begins flowing from the voltage source 510 through the inductor 520, allowing the inductor 520 to charge between times $t_1$ and $t_2$. Switches 430 and 535 are turned off, disconnecting the respective paths to ground for amplified square wave signal 428 and feedback signal 438.

At time $t_2$, when ramp signal 406 begins to exceed the control signal 444, the pulse signal 412 goes "high." Ramp signal 406 continues to increase until reaching its limit and saturating at that value. With pulse signal 412 in the "high" state, NOR gate 505 has one "high" input and drives the first switching signal 416 to a logic "low," shutting off the switch 418. The change in current caused by shutting off switch 418 causes the inductor 520 to generate an inductive "kick" across the switch 424, resulting in a sharp increase in voltage for the amplified square wave signal 428 (and the feedback signal 438). With the paths through switches 430, 535 to ground disconnected, the increased voltage is held on capacitors 525, 531, 532.

At time $t_3$, the voltage of amplified square wave signal 428 is considered a logic "high." The voltage level needed to transition to a "high" state (and thus the distance between times $t_2$ and $t_3$) will vary based on the particular components used in boost arrangement 500, the sensitivity of downstream components such as those included in the sensing area, etc.

At time $t_4$, and just prior to the input signal 402 transitioning "high" at time $t_5$, the feedback signal 438 is sampled by the feedback module 440. Based on the comparison of the sampled feedback signal 438 with a reference signal 442, the feedback module 440 may adjust the control signal 444 for subsequent cycles of the input signal 402. At time $t_5$, the input signal 402 transitions "high" and the process repeats.

As shown, the duty cycle of the amplified square wave signal 428 is $((t_5-t_3)/T)$, which is slightly less than the duty cycle of the input signal 402 $((t_1-t_0)/T)$. In some embodiments, an acceptable duty cycle for the amplified square wave signal 428 is dependent upon the properties and sensing requirements of the input device (e.g., touchscreen) being used with the active input device (e.g., active pen). In some cases, a duty cycle falling within a predetermined range may be acceptable. For example, a duty cycle of the amplified square wave signal 428 between 20% and 80% may be acceptable for a particular input device. In some embodiments, the active input device may be configured to work with a number of different input devices, so that the duty cycle of the amplified square wave 428 is adaptively set based on the particular input device being used with the active input device.

The flexibility afforded by a range of acceptable duty cycles also allows flexibility in the selection of components of the boost arrangement 500. Other considerations, such as size of the components, their power consumption, etc. may influence the selection. For example, an inductor 520 having a smaller size may be desirable to save space on a circuit board, and the smaller inductor may charge to a desired level more quickly (e.g., say times $t_2$, $t_3$ would be shifted further to the left). So long as the resulting duty cycle of the amplified square wave signal 438 remains within the acceptable range, the smaller inductor may be used. Similarly, the design of comparator 408 may be selected based on the speed required. If a lower power consuming comparator having a relatively slower speed than a more complex comparator design can produce an acceptable duty cycle, the slower comparator may be used. Of course, the selection of the components for the boost arrangement 500 will be interrelated, with certain design trade-offs for each suitable configuration.

In some embodiments, adapting the duty cycle of the input signal 402 could also provide a suitable duty cycle for the amplified square wave signal 428. For example, shifting transition time $t_1$ to the left (a shorter duty cycle for input signal 402) could result in a longer duty cycle for the amplified square wave signal 428. Thus, in one possible configuration, the boost arrangement 500 could provide a suitable control signal to the source of the input signal 402 (e.g., controller 320) to adjust the duty cycle at the source. In another possible configuration, the boost arrangement 500 could provide a suitable control signal to the ramp generator module 404 to affect when ramping is triggered relative to the transition time of the input signal 402. For example, the control signal could be subtracted from the input signal with the subtraction result used to trigger the ramp generator. However, other configurations are possible.

Figure 7:
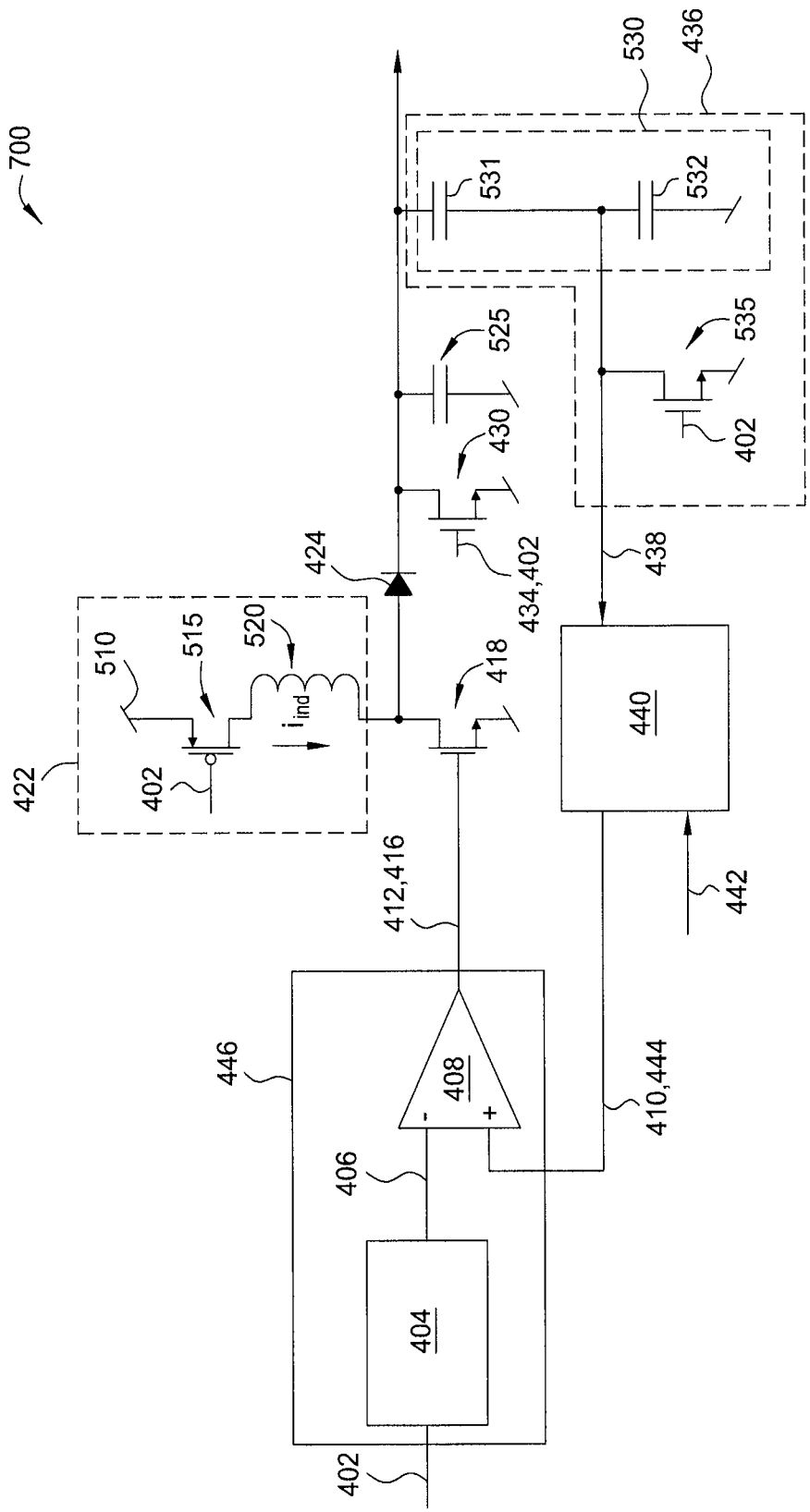
FIG. 7 illustrates an exemplary implementation of a boost arrangement, according to embodiments described herein.

FIG. 7 illustrates an exemplary implementation of a boost arrangement, according to embodiments described herein. Boost arrangement 700 represents one possible implementation of the boost arrangement 330, suitable for use in the active input device 300.

In boost arrangement 700, the input signal 402 is received at the variable-width pulse generator 446, and the ramp generator module 404 produces ramp signal 406. In this embodiment, the ramp signal 406 is received at a negative terminal of the comparator 408, while the control signal 444 is received as the second input signal 410 at the positive terminal of the comparator 408. The pulse signal 412 is generated based on the comparison. In this embodiment, the pulse signal 412 is provided to the switch 418 as the first switching signal 416, and no processing module 414 is required to produce the first switching signal 416. The remaining components of the boost arrangement 700 generally operate in a similar manner to the operation discussed above with respect to boost arrangements 330, 500.

Figure 8:
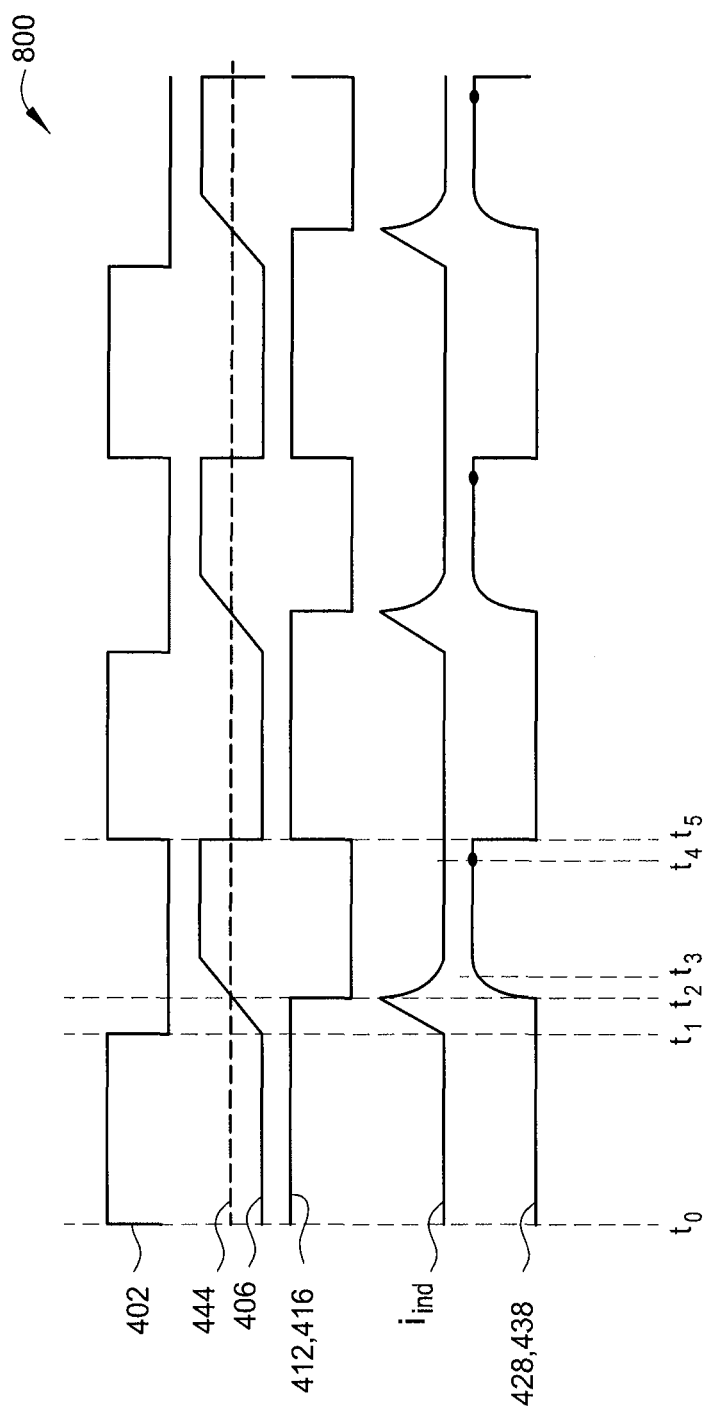
FIG. 8 illustrates exemplary operation of a boost arrangement, according to embodiments described herein.

FIG. 8 illustrates several signal plots illustrating operation of an exemplary boost arrangement, according to embodiments described herein. Specifically, chart 800 corresponds to operation of the boost arrangement 700.

Input signal 402 is a square wave having an approximately 50% duty cycle—that is, the amount of "on" time ($t_1$-$t_0$) equals the amount of "off" time ($t_5$-$t_1$). As discussed above, the duty cycle of the input signal 402 can be varied based on duty cycle requirements for the output signal (i.e., amplified square wave signal 428).

At time $t_0$, the input signal 402 is driven "high" (logic "1"). The switch 430 is turned on, providing a path from the output terminal (cathode) of switch 424 to ground and causing the amplified square wave signal 428 to go "low" (logic "0").

Ramp signal 406 also goes "low" when input signal 402 transitions "high." The control signal 444 is shown as a DC voltage level greater than the ramp signal 406 at time $t_0$, causing pulse signal 412 (first switching signal 416) to be driven "high." The first switching signal 416 turns on the switch 418, and the channel of switch 418 provides a path from the first terminal (anode) of the switch 424 to ground. However, while input signal 402 remains "high," the inductor 520 is disconnected from the voltage source 510 and is not charging. In this embodiment, the switching of switch 515 controls current flow through the inductor 520.

At time $t_1$, the input signal 402 is driven low, causing ramp signal 406 to begin increasing. Between times $t_1$ and $t_2$, the ramp signal 406 remains less than the control signal 444, so that pulse signal 412 remains "high" and switch 418 remains on. However, because input signal 402 has transitioned "low," switch 515 is turned on and current begins flowing from the voltage source 510 through the inductor 520 and through the switch 418 to ground, which causes the inductor 520 to begin charging.

At time $t_2$, when ramp signal 406 begins to exceed the control signal 444, the pulse signal 412 goes "low." Ramp signal 406 continues to increase until reaching its limit and saturating at that value. The comparator 408 drives the pulse signal 412 (first switching signal 416) "low," shutting off the switch 418. The change in current caused by shutting off switch 418 causes the inductor 520 to generate inductive "kick" across the switch 424, resulting in the sharp increase in voltage for the amplified square wave signal 428 (and the feedback signal 438). With the paths through switches 430, 535 to ground disconnected, the increased voltage is held on capacitors 525, 531, 532.

At time $t_3$, the voltage of amplified square wave signal 428 is considered a logic "high." As described above, the voltage level corresponding to the transition to "high" depends on the characteristics of the components involved. At time $t_4$, the feedback signal 438 is sampled by the feedback module 440. At time $t_5$, the input signal 402 transitions "high" and the process repeats.

Figure 9:
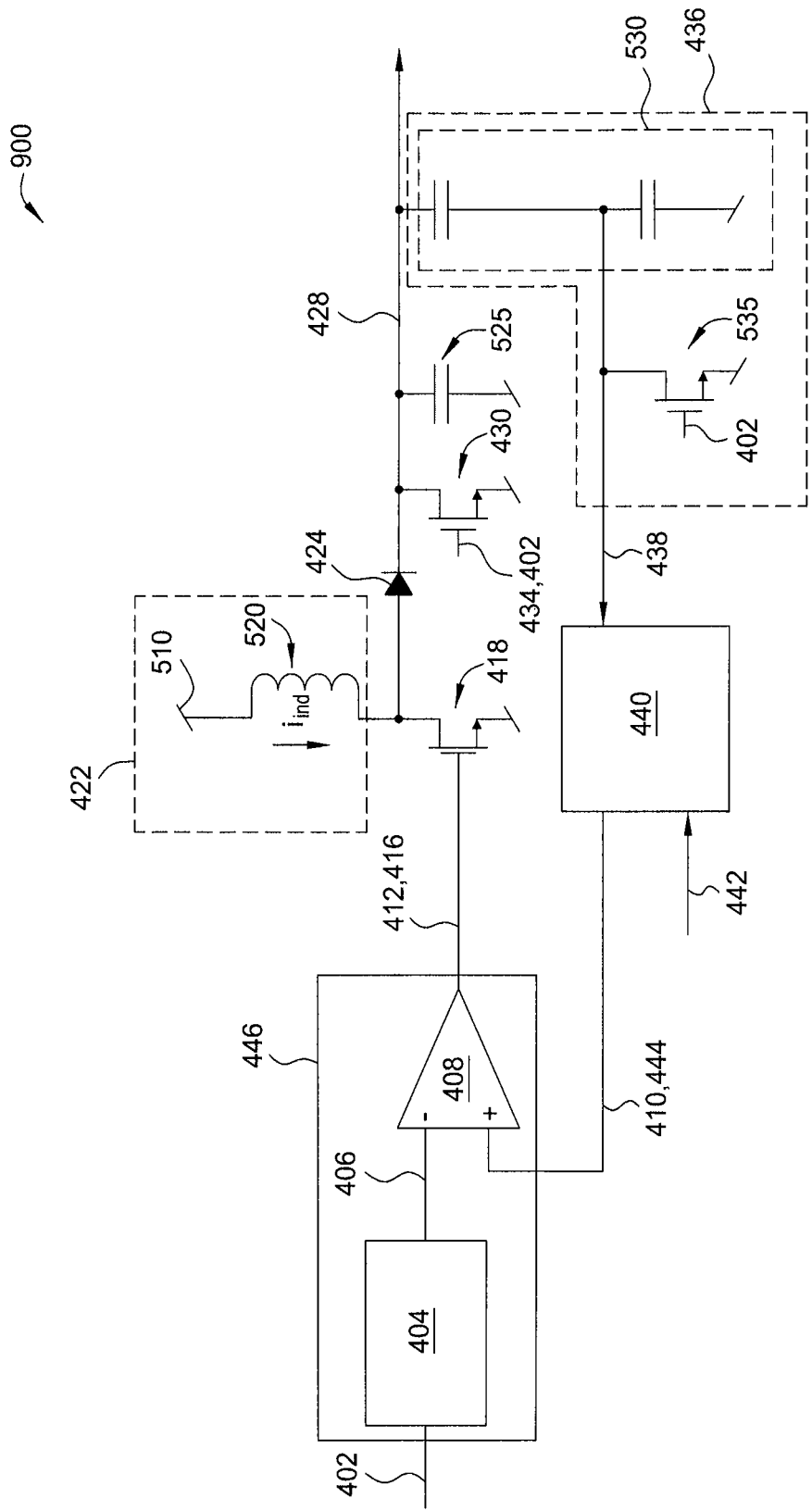
FIG. 9 illustrates an exemplary implementation of a boost arrangement, according to embodiments described herein.

FIG. 9 illustrates an exemplary implementation of a boost arrangement, according to embodiments described herein. Boost arrangement 900 represents one possible implementation of the boost arrangement 330, suitable for use in the active input device 300. Boost arrangement 900 differs from the boost arrangement 700 in that the inductive energy source 422 does not include switch 515. Instead, the switching of switch 418 is used to control the charging of inductor 520.

Figure 10:
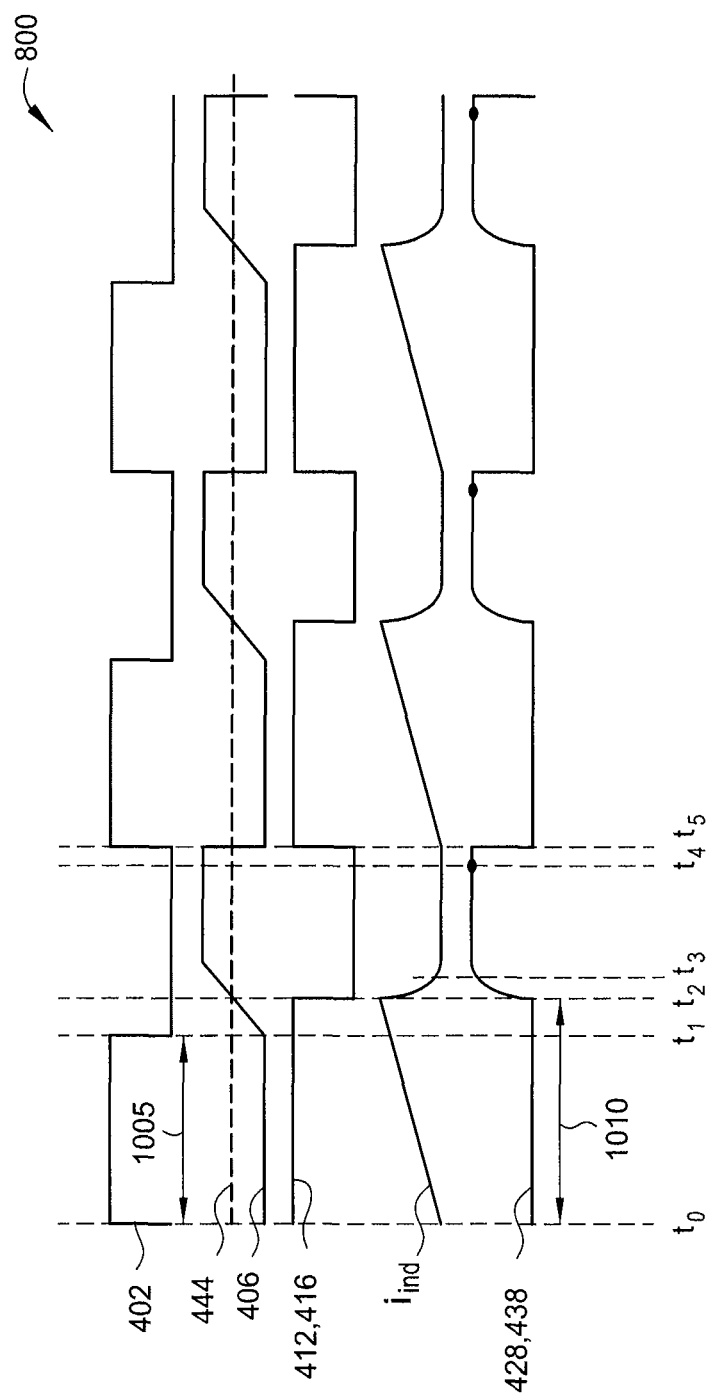
FIG. 10 illustrates exemplary operation of a boost arrangement, according to embodiments described herein.

FIG. 10 illustrates several signal plots illustrating operation of an exemplary boost arrangement, according to embodiments described herein. Specifically, chart 1000 corresponds to operation of the boost arrangement 900. The "on" time of input signal 401 between $t_0$ and $t_1$ is represented by period 1005.

As long as the period during which switch 418 is switched on (between $t_0$ and $t_2$; represented by period 1010) extends past period 1005 into the period during which the input signal 402 is driven "low," the boost arrangement 900 can produce a suitable amplified square wave 438. In many cases, this condition may be met where the ramp signal 406 has more than a substantially instantaneous transition from a reset level to the level of control signal 444—i.e., a non-zero amount of time between times $t_1$ and $t_2$. The length of period 1010 may depend on the properties of the inductor 520, e.g., how long it takes to charge the inductor 520 to a desired level. The remaining depicted times $t_3$, $t_4$, $t_5$ generally correspond to the description of those same times with respect to FIG. 8.

Figure 11:
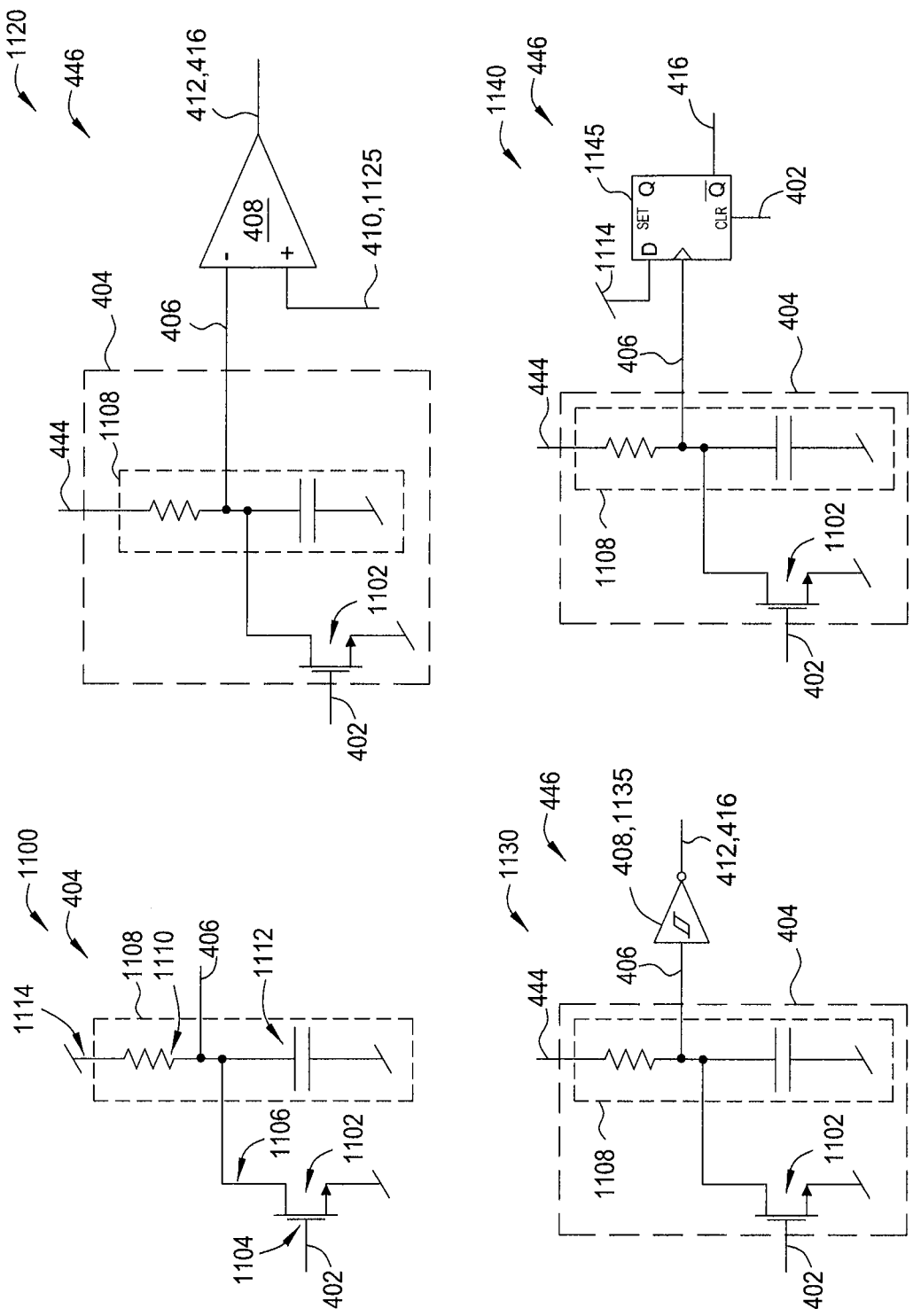
FIG. 11 illustrates several implementations of a ramp generator module, according to embodiments described herein.

FIG. 11 illustrates several implementations of a ramp generator module, according to embodiments described herein. Specifically, the arrangements 1100, 1120, 1130, and 1140 represent possible implementations of the ramp generator module 404 and/or variable-width pulse generator 446, suitable for use in a boost arrangement 330.

Arrangement 1100 includes a switch 1102 (NFET) having a control terminal 1104 (gate) and output terminal 1106 (drain). Arrangement 1100 also includes a voltage divider arrangement 1108 coupled with a voltage source 1114. In one embodiment, the voltage source 1114 differs from the voltage source 510. For example, voltage source 1114 has a first predefined voltage (e.g., $V_{DD}$) while voltage source 510 has a second predefined voltage (e.g., $V_{BOOST}$). The voltage divider arrangement 1108 comprises a resistor 1110 in series with a capacitor 1112. The output terminal 1106 of switch 1102 is coupled with the voltage divider arrangement 1108 at the point of series connection, and the ramp signal 406 is produced at the same point.

The input signal 402 drives the input terminal 1104, selectively coupling the series connection point with ground through the channel of switch 1102. For example, when input signal 402 is "high," the switch 1102 provides a path for current from the voltage source 1114 to ground, bypassing capacitor 1112. Accordingly, the ramp signal 406 is coupled to ground during this period. When input signal 402 transitions to "low," the path to ground is removed, and the current from voltage source 1114 flows through capacitor 1112, increasing the voltage across the capacitor and thereby increasing the voltage of the ramp signal 406. The process repeats for subsequent transitions of input signal 402.

In one embodiment, the arrangement 1100 may include a switch (PFET) in series with the resistor 1110, configured to halt current flow from the voltage source 1114 when the input signal 402 is "high," conserving power. In an alternative embodiment, any suitable current source may be substituted for the resistor 1110.

The ramp generator module 404 of arrangement 1120 is configured similar to that of arrangement 1100. However, in this case the control signal 444 is the power source connected with the voltage divider arrangement 1108. The ramp signal 406 is connected with a negative input of the comparator 408, and a predetermined threshold voltage 1125 is provided as the second input signal 410. By adjusting the control signal 444, the ramp rate of the ramp signal 406 can be modified to provide any suitable timing for the ramp signal 406 and pulse signal 412 (and possibly first switching signal 416). In this embodiment, the comparator 408 may be configured to operate across a reduced range of voltages, providing better response and possibly reduced power consumption.

The ramp generator module 404 included in arrangements 1130, 1140 is configured similarly to that of arrangement 1120, using control signal 444 as the power source for the voltage divider arrangement 1108. However, in arrangement 1130 the ramp signal 406 is output to a Schmitt trigger 1135 (an example of comparator 408), which provides the pulse signal 412 (and possibly first switching signal 416). In an alternative embodiment depicted in arrangement 1140, the comparator 408 is replaced by a D flip-flop 1145, with the ramp signal 406 connected with a clock input of the D flip-flop 1145. On the rising edge of the ramp signal 406, the output Q is set to the D value (voltage source 1114, e.g., $V_{DD}$) and the output NOT Q drives the first switching signal 416 "low." The D flip-flop 1145 is reset when input signal 402 goes "high," causing the output NOT Q to drive the first switching signal 416 "high."

Although not shown, other configurations of the variable-width pulse generator 446 are possible. In one embodiment, a variable-width pulse generator 446 comprises an oscillator and a counter. A digital count from the counter (whether an increasing or decreasing count) is provided as feedback to the variable-width pulse generator 446. When the digital count is below a predetermined digital value, the output of the variable-width pulse generator 446 is at a predetermined logic level (e.g., logic "high" or "low," as desired).

Figure 12:
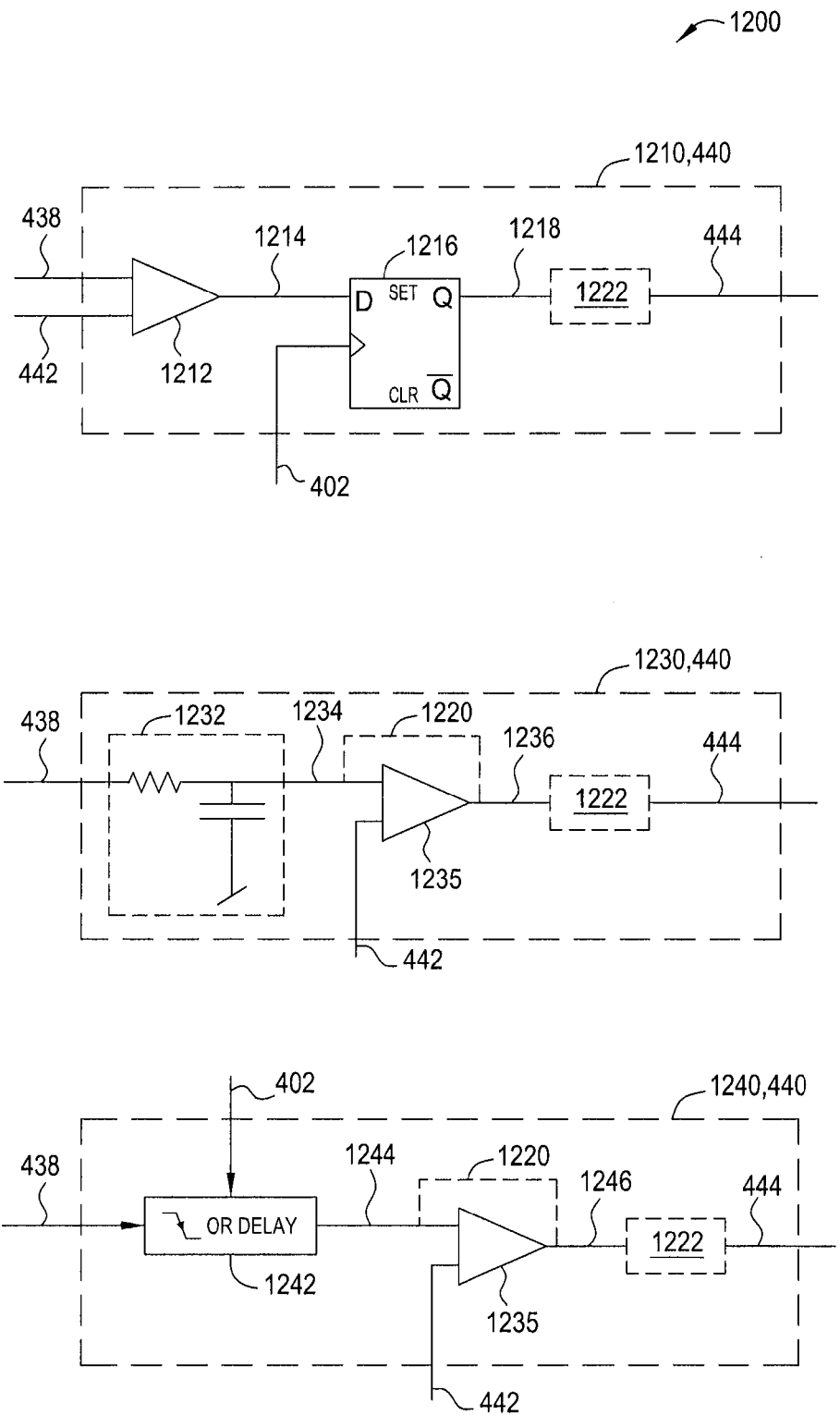
FIG. 12 illustrates several implementations of a feedback module, according to embodiments described herein.

FIG. 12 illustrates several implementations of a feedback module, according to embodiments described herein. Specifically, the arrangements 1200, 1230, and 1240 represent possible implementations of the feedback module 440, suitable for use in a boost arrangement 330.

In arrangement 1210, feedback signal 438 is provided to one input terminal of a comparator 1212. Reference signal 442 is provided to the other input terminal of the comparator 1212. The polarities of the terminals of comparator 1211 are not designated, as the configurations may vary in the arrangement 1210, as will be understood by one of ordinary skill in the art. Based on the comparison, comparator 1212 produces a signal 1214 that is coupled with the D input of a D flip-flop 1216. The input signal 402 is provided to the clock input of the D flip-flop 1212. On rising edges of the input signal 402, the signal 1214 is sampled and provided as signal 1218 from the Q output of the D flip-flop 1212. Because the comparator 1212 typically includes some delay in responding to a change in inputs, sampling signal 1214 actually reflects the voltage of feedback signal 438 just prior to the rising edge of the input signal 402. The signal 1218 may be further processed in an optional processing module 1222 to produce the control signal 444. The processing module 1222 may include one or more analog and/or digital logic elements for adapting the pulse signal 1218 into a desired form for control signal 444.

In arrangement 1230, feedback signal 438 is provided to a low-pass filter assembly 1232 that generally operates to determine the average voltage of the feedback signal 438. The low-pass filter assembly 1232 may have any suitable configuration, such as the RC circuit depicted. While some resolution of the peak-to-peak voltage of the feedback signal 438 may not be preserved through the filtering process, in many cases an average voltage may be a suitable measure for generating the control signal 444. The low-pass filter assembly 1232 produces a filtered signal 1234 (representing an average voltage of the feedback signal 438) that is input to comparator 1235 and compared with the reference signal 442. The pulse signal 1236 may be further processed at processing module 1222 and/or fed back to an input of the comparator 1235 via path 1220. In one embodiment, path 1220 also includes one or more analog or digital logic elements for adjusting the pulse signal 1236. The processing module 1222 may also include one or more analog and/or digital logic elements for adapting the pulse signal 1236 into a desired form for control signal 444.

In arrangement 1240, feedback signal 438 is provided as an input to a processing module 1242. The processing module 1242 may also receive input signal 402 as an input. To sample the feedback signal 438 just prior to its reset, the processing module 1242 may perform a "one-shot" sampling triggered off the falling edge of input signal 402. Alternatively, the processing module 1242 may delay a local copy of the input signal 402 and sample the local copy upon detecting a rising edge of the non-delayed input signal 402.

The processing module 1246 produces a signal 1244 that is input to comparator 1235 and compared with the reference signal 442. The pulse signal 1246 may be further processed at processing module 1222 and/or fed back to an input of the comparator 1235 via path 1220. In one embodiment, path 1220 also includes one or more analog or digital logic elements for adjusting the pulse signal 1246. The processing module 1222 may also include one or more analog and/or digital logic elements for adapting the pulse signal 1246 into a desired form for control signal 444.

Figure 13:
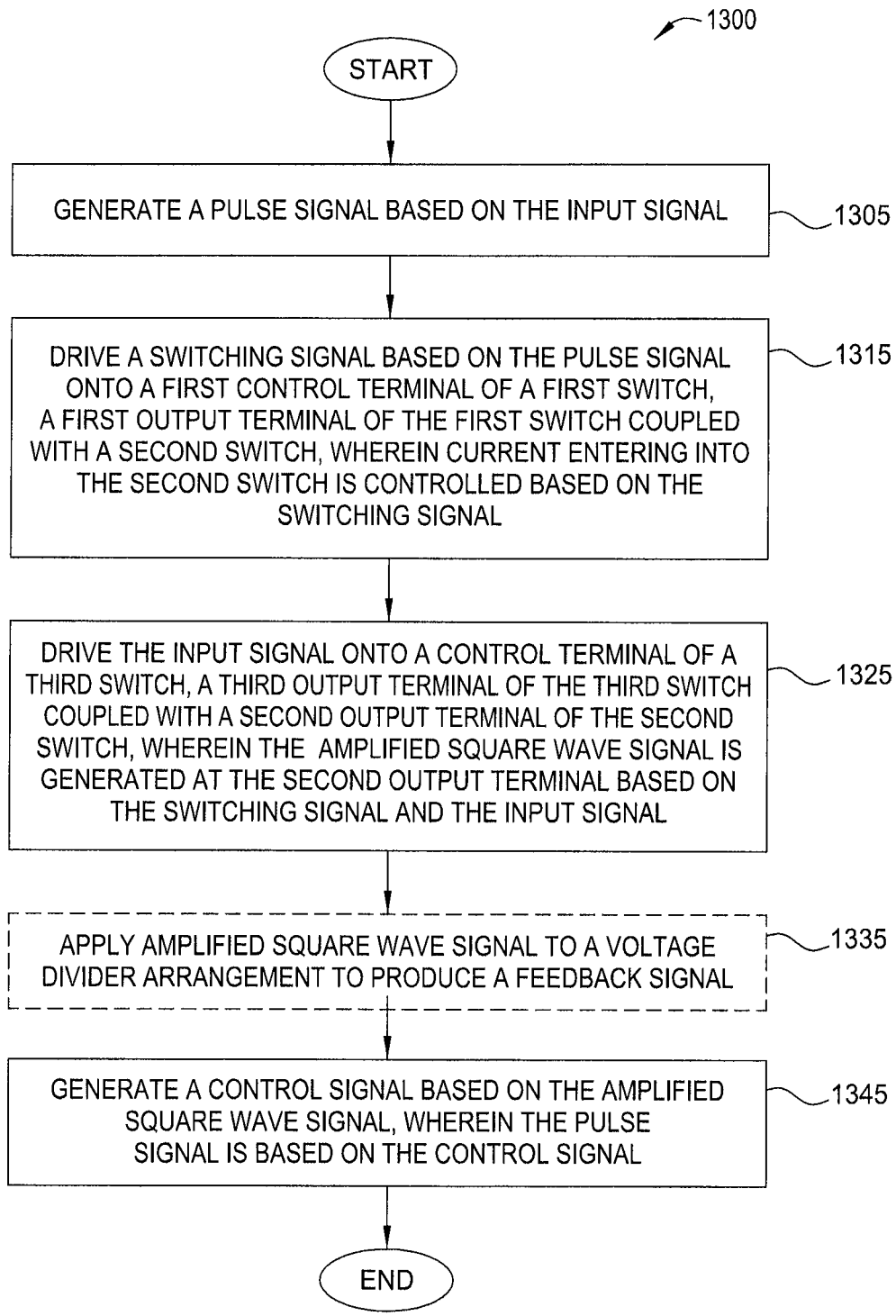
FIG. 13 illustrates a method of generating an amplified square wave signal based on an input signal, according to embodiments described herein.

FIG. 13 illustrates a method of generating an amplified square wave signal based on an input signal, according to embodiments described herein. Method 1300 may generally be used with any of the boost arrangements and active input devices described herein, and may incorporate any of the features and techniques described with respect thereto.

At block 1305, a variable-width pulse generator generates a pulse signal based on the input signal. In some embodiments, generating a pulse signal includes generating a ramp signal based on the input signal, and comparing the ramp signal with a second signal to produce the pulse signal. In some embodiments, the ramp rate of the ramp signal is controlled by a control signal produced by a feedback loop of the boost arrangement. In some embodiments, the second signal is the control signal from the feedback loop. In other embodiments, the second signal is a predetermined threshold voltage.

At block 1315, the boost arrangement drives a switching signal based on the pulse signal onto a first control terminal of a first switch, where an output terminal of the first switch is coupled with second switch (e.g., an anode of a diode). The current entering into the second switch is controlled based on the switching signal. In some embodiments, the switching signal is the pulse signal. In other embodiments, processing is performed on the pulse signal to produce the switching signal.

At block 1325, the boost arrangement drives the input signal onto a control terminal of a third switch, where an output terminal of the third switch is coupled with a second, output terminal of the second switch (e.g., a cathode of the diode). The input signal selectively couples the output terminal with ground through the third switch. Based on the switching signal and the input signal, the amplified square wave signal is formed at the output terminal of the second switch. In some embodiments, the amplified square wave signal has the same period as the input signal but a different duty cycle.

At optional block 1335, the amplified square wave signal is applied to a voltage divider arrangement to produce a feedback signal. In some embodiments, the feedback signal is taken from the point of series connection of the elements of the voltage divider arrangement, and represents a scaled version of the amplified square wave signal.

At block 1345, a feedback module generates a control signal based on the amplified square wave signal. In one embodiment, the control signal is based on the feedback signal produced in block 1335. In another embodiment, the feedback signal is the amplified square wave signal. The generated control signal is used to affect the width of the pulse signal produced at block 1305, by affecting the production of the ramp signal at the ramp generator module and/or affecting the comparison of the ramp signal with a second signal at a comparator. Method 1300 ends following completion of block 1345.

Thus, the embodiments and examples set forth herein were presented in order to best explain the embodiments in accordance with the present technology and its particular application and to thereby enable those skilled in the art to make and use the present technology. However, those skilled in the art will recognize that the foregoing description and examples have been presented for the purposes of illustration and example only. The description as set forth is not intended to be exhaustive or to limit the disclosure to the precise form disclosed.

In view of the foregoing, the scope of the present disclosure is determined by the claims that follow.

I claim:

1. A system for generating an amplified square wave signal based on an input signal, the system comprising:
   a variable-width pulse generator configured to generate, based on the input signal, a pulse signal having a pulse width;
   a feedback module configured to generate a control signal based on the amplified square wave signal, the pulse width of the pulse signal based on the control signal;
   a first switch having a first control terminal and a first output terminal;
   a second switch having a second control terminal and a second output terminal, the second output terminal coupled with the first control terminal of the first switch, wherein the second switch is configured to receive at the second control terminal a first switching signal based on the pulse signal; and
   a third switch having a third control terminal and a third output terminal, the third output terminal coupled with the first output terminal of the first switch, wherein the third switch is configured to receive a second switching signal at the third control terminal,
   wherein in response to the first and second switching signals provided to the second and third switches, the amplified square wave signal is generated at the first output terminal of the first switch.

2. The system of claim 1, further comprising an inductive energy source coupled with the first switch and the second switch, wherein the inductive energy source is configured to source inductive energy across a selected one of the first switch and the second switch based on the first switching signal, and wherein the amplified square wave signal is based on the inductive energy.

3. The system of claim 1, wherein the variable-width pulse generator comprises:
   a ramp generator configured to receive the input signal and to generate a ramp signal; and
   a first comparator configured to generate the pulse signal based on a comparison of the ramp signal with a second signal.

4. The system of claim 3, wherein the ramp generator comprises:
   a fourth switch having a fourth control terminal and a fourth output terminal, the fourth switch configured to receive the input signal at the fourth control terminal; and
   a first voltage divider arrangement comprising a resistor connected in series with a first capacitor,
   wherein the fourth output terminal is coupled with the first voltage divider arrangement at the series connection, and wherein the ramp signal is generated at the series connection.

5. The system of claim 4, wherein the first voltage divider arrangement further comprises a fifth switch connected in series with the resistor, wherein the fifth switch is configured to prevent current flow through the resistor when the input signal is at a first predetermined logic level.

6. The system of claim 1, further comprising:
a second voltage divider arrangement coupled with the first output terminal of the first switch and comprising a second capacitor connected in series with a third capacitor,
wherein the second voltage divider arrangement is configured to receive the amplified square wave provided as an input voltage,
wherein the feedback module is coupled with the second voltage divider arrangement at the series connection and is further configured to receive a feedback signal based on the amplified square wave signal.

7. The system of claim 6, further comprising:
a sixth switch having a corresponding output terminal that is coupled with the second voltage divider arrangement at the series connection, wherein the sixth switch is configured to reset the feedback signal by conducting the feedback signal to ground when the input signal is at a first predetermined logic level.

8. The system of claim 7, wherein the feedback module is configured to receive a feedback signal based on the amplified square wave signal, wherein the feedback module is further configured to sample the feedback signal prior to reset by one of:
triggering the sampling upon detecting a falling edge of the input signal; and
delaying a local copy of the input signal and triggering the sampling upon detecting a rising edge of the input signal.

9. The system of claim 1, wherein the feedback module comprises:
a second comparator configured to compare a received feedback signal that is based on the amplified square wave signal with a reference signal; and
a flip-flop coupled configured to latch a value of an output of the second comparator at a rising edge of the input signal,
wherein the control signal is generated based on the latched value.

10. The system of claim 1, wherein the feedback module comprises a low-pass filter assembly configured to determine an average voltage of a received feedback signal that is based on the amplified square wave signal, wherein the control signal is generated based on the determined average voltage.

11. An active input device comprising:
a controller configured to generate an unamplified input signal; and
a boost arrangement coupled with the controller and configured to generate an amplified square wave signal based on the input signal, the boost arrangement comprising:
a variable-width pulse generator configured to generate, based on the input signal, a pulse signal having a pulse width;
a feedback module configured to generate a control signal based on the amplified square wave signal, the pulse width of the pulse signal based on the control signal;
a first switch having a first control terminal and a first output terminal;
a second switch having a second control terminal and a second output terminal, the second output terminal coupled with the first control terminal of the first switch, wherein the second switch is configured to receive at the second control terminal a first switching signal based on the pulse signal; and
a third switch having a third control terminal and a third output terminal, the third output terminal coupled with the first output terminal of the first switch, wherein the third switch is configured to receive a second switching signal at the third control terminal,
wherein in response to the first and second switching signals provided to the second and third switches, the amplified square wave signal is generated at the first output terminal of the first switch.

12. The active input device of claim 11, wherein the boost arrangement further comprises an inductive energy source coupled with the first switch and the second switch, wherein the inductor is configured to source inductive energy through the first switch based on the first switching signal.

13. The active input device of claim 11, wherein the variable-width pulse generator comprises:
a ramp generator configured to receive the input signal and to generate a ramp signal; and
a first comparator configured to generate the pulse signal based on a comparison of the ramp signal with a second signal.

14. The active input device of claim 11, wherein the boost arrangement further comprises:
a voltage divider arrangement coupled with the first output terminal and comprising a first capacitor connected in series with a second capacitor,
wherein the voltage divider arrangement is configured to receive the amplified square wave provided as an input voltage,
wherein the feedback module is coupled with the voltage divider arrangement at the series connection and is further configured to receive a feedback signal based on the amplified square wave signal.

15. The active input device of claim 11, wherein the feedback module comprises:
a second comparator configured to compare a received feedback signal that is based on the amplified square wave signal with a received reference signal; and
a flip-flop coupled configured to latch a value of an output of the second comparator at a rising edge of the input signal,
wherein the control signal is generated based on the latched value.

16. The active input device of claim 11, wherein the feedback module comprises a low-pass filter assembly configured to determine an average voltage of a received feedback signal that is based on the amplified square wave signal, wherein the control signal is based on the determined average voltage.

17. The active input device of claim 11, wherein the feedback module is configured to receive a feedback signal based on the amplified square wave signal, wherein the feedback module is further configured to sample the feedback signal prior to reset by one of:
triggering the sampling upon detecting a falling edge of the input signal; and
delaying a local copy of the input signal and triggering the sampling upon detecting a rising edge of the input signal.

18. A method of generating an amplified square wave signal based on an input signal, the method comprising:
generating, based on the input signal, a pulse signal having a pulse width;
driving a switching signal based on the pulse signal onto a first control terminal of a first switch, wherein a first output terminal of the first switch is coupled with a second switch having a second control terminal and a second output terminal, wherein current entering into the second switch is controlled based on the switching signal;

driving the input signal onto a third control terminal of a third switch, wherein a third output terminal of the third switch is connected to the second output terminal of the second switch, wherein the amplified square wave signal is generated at the second output terminal based on the switching signal and on the input signal; and generating a control signal based on the amplified square wave signal, wherein the pulse width of the pulse signal is based on the control signal.

19. The method of claim 18, further comprising:

applying the amplified square wave signal to a voltage divider arrangement to produce a feedback signal, the voltage divider arrangement comprising first and second capacitors connected in series and the feedback signal produced at the series connection, wherein the control signal is generated based on the feedback signal.

20. The method of claim 19, further comprising sampling the feedback signal by performing one of:

triggering the sampling upon detecting a falling edge of the input signal; and delaying a local copy of the input signal and triggering the sampling upon detecting a rising edge of the input signal.

* * * * *